US009219956B2

(12) United States Patent
McCormack et al.

(10) Patent No.: US 9,219,956 B2
(45) Date of Patent: Dec. 22, 2015

(54) CONTACTLESS AUDIO ADAPTER, AND METHODS

(71) Applicants: Gary D McCormack, Tigard, OR (US); Ian A Kyles, West Linn, OR (US)

(72) Inventors: Gary D McCormack, Tigard, OR (US); Ian A Kyles, West Linn, OR (US)

(73) Assignee: KEYSSA, INC., Mountain View, CA (US)

( * ) Notice: Subject to any disclaimer, the term of this patent is extended or adjusted under 35 U.S.C. 154(b) by 295 days.

(21) Appl. No.: 13/776,727

(22) Filed: Feb. 26, 2013

(65) Prior Publication Data

US 2013/0266154 A1    Oct. 10, 2013

Related U.S. Application Data

(63) Continuation-in-part of application No. 13/427,576, filed on Mar. 22, 2012, and a continuation-in-part of application No. 12/655,041, filed on Dec. 21, 2009, now Pat. No. 8,554,136, and a continuation-in-part of (Continued)

(51) Int. Cl.
*H04R 3/00* (2006.01)
*H01Q 1/22* (2006.01)

(52) U.S. Cl.
CPC ............... *H04R 3/00* (2013.01); *H01Q 1/2283* (2013.01); *H01L 2224/48137* (2013.01); *H01L 2924/3011* (2013.01); *H01L 2924/3025* (2013.01)

(58) Field of Classification Search
CPC ............ H04R 3/00; H01Q 1/2283; H01L 2244/48137; H01L 2924/00
USPC ........... 235/492; 307/151; 320/103; 323/222; 370/474, 277, 466; 375/295, 219, 259; 381/117; 455/41.1, 41.2, 234.1, 39, 455/63.1, 67.11, 113; 704/271; 343/893, 343/905
See application file for complete search history.

(56) References Cited

U.S. PATENT DOCUMENTS

| 3,796,831 A | 3/1974 | Bauer |
| 4,485,312 A | 11/1984 | Kusakabe et al. |
| 4,497,068 A | 1/1985 | Fischer |

(Continued)

FOREIGN PATENT DOCUMENTS

EP    2 360 923    8/2011

OTHER PUBLICATIONS

Universal Serial Bus, Wikipedia, 2012 (32 pages).

(Continued)

*Primary Examiner* — Gerald Gauthier
(74) *Attorney, Agent, or Firm* — Van Court & Aldridge LLP

(57) ABSTRACT

A contactless, electromagnetic (EM) replacement for cabled Standards-based interfaces (such as USB, I2S) which handles data transfer requirements associated with the Standard, and capable of measuring and replicating relevant physical conditions on data lines so as to function compatibly and transparently with the Standard. A contactless link between devices having transceivers. A non-conducting housing enclosing the devices. A dielectric coupler facilitating communication between communications chips. Conductive paths or an inductive link providing power between devices. An audio adapter communicates over a contactless link with a source device, and via a physical link with a destination device such as a conventional headset. Power may be provided to the adapter from the source device, and by the adapter to the destination device.

17 Claims, 5 Drawing Sheets

Related U.S. Application Data application No. 13/713,564, filed on Dec. 13, 2012, now Pat. No. 8,794,980, and a continuation-in-part of application No. 13/760,089, filed on Feb. 6, 2013.

(60) Provisional application No. 61/467,334, filed on Mar. 24, 2011, provisional application No. 61/203,702, filed on Dec. 23, 2008, provisional application No. 61/570,707, filed on Dec. 14, 2011, provisional application No. 61/605,981, filed on Mar. 2, 2012, provisional application No. 61/661,756, filed on Jun. 19, 2012.

(56) References Cited

U.S. PATENT DOCUMENTS

| | | |
|---|---|---|
| 4,694,504 A | 9/1987 | Porter et al. |
| 5,543,808 A | 8/1996 | Feigenbaum |
| 5,621,913 A | 4/1997 | Tuttle et al. |
| 5,754,948 A | 5/1998 | Metze |
| 5,773,878 A | 6/1998 | Lim et al. |
| 5,956,626 A | 9/1999 | Kaschke et al. |
| 6,351,237 B1 | 2/2002 | Martek et al. |
| 6,373,447 B1 | 4/2002 | Rostoker et al. |
| 6,490,443 B1 | 12/2002 | Freeny, Jr. |
| 6,492,973 B1 | 12/2002 | Kuroki et al. |
| 6,534,784 B2 | 3/2003 | Eliasson et al. |
| 6,542,720 B1 | 4/2003 | Tandy |
| 6,607,136 B1 | 8/2003 | Atsmon et al. |
| 6,718,163 B2 | 4/2004 | Tandy |
| 6,915,529 B1 | 7/2005 | Suematsu et al. |
| 6,967,347 B2 | 11/2005 | Estes et al. |
| 7,107,019 B2 | 9/2006 | Tandy |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,612,630 B2 | 11/2009 | Miller |
| 7,617,342 B2 | 11/2009 | Rofougaran |
| 7,645,143 B2 | 1/2010 | Rohrbach et al. |
| 7,656,205 B2 | 2/2010 | Chen et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,881,675 B1 | 2/2011 | Gazdzinski |
| 7,889,022 B2 | 2/2011 | Miller |
| 7,907,924 B2 | 3/2011 | Kawasaki |
| 7,929,474 B2 | 4/2011 | Pettus et al. |
| 7,975,079 B2 | 7/2011 | Bennett et al. |
| 8,014,416 B2 | 9/2011 | Ho et al. |
| 8,036,629 B2 | 10/2011 | Tandy |
| 8,041,227 B2 | 10/2011 | Colcombe et al. |
| 8,087,939 B2 | 1/2012 | Rohrbach et al. |
| 8,121,542 B2 | 2/2012 | Zack et al. |
| 8,135,367 B2 * | 3/2012 | Rofougaran et al. ...... 455/234.1 |
| 8,183,935 B2 | 5/2012 | Milano et al. |
| 8,714,459 B2 * | 5/2014 | McCormack et al. ........ 235/492 |
| 2004/0213356 A1 * | 10/2004 | Burke ........................... 375/295 |
| 2004/0214621 A1 | 10/2004 | Ponce De Leon et al. |
| 2005/0109841 A1 | 5/2005 | Ryan et al. |
| 2005/0140436 A1 | 6/2005 | Ichitsubo et al. |
| 2006/0038168 A1 | 2/2006 | Estes et al. |
| 2006/0159158 A1 | 7/2006 | Moore et al. |
| 2006/0258289 A1 | 11/2006 | Dua |
| 2007/0024504 A1 | 2/2007 | Matsunaga |
| 2007/0063056 A1 | 3/2007 | Gaucher et al. |
| 2007/0229270 A1 | 10/2007 | Rofougaran |
| 2007/0278632 A1 | 12/2007 | Zhao et al. |
| 2008/0089667 A1 | 4/2008 | Grady |
| 2008/0112101 A1 | 5/2008 | McElwee et al. |
| 2008/0150799 A1 | 6/2008 | Hemmi et al. |
| 2008/0159243 A1 | 7/2008 | Rofougaran |
| 2008/0192726 A1 | 8/2008 | Mahesh et al. |
| 2008/0195788 A1 | 8/2008 | Tamir et al. |
| 2008/0290959 A1 | 11/2008 | Ali et al. |
| 2009/0006677 A1 | 1/2009 | Rofougaran |
| 2009/0009337 A1 | 1/2009 | Rofougaran |
| 2009/0037628 A1 | 2/2009 | Rofougaran |
| 2009/0076825 A1 * | 3/2009 | Bradford et al. .............. 704/271 |
| 2009/0094506 A1 | 4/2009 | Lakkis |
| 2009/0098826 A1 | 4/2009 | Zack et al. |
| 2009/0128090 A1 * | 5/2009 | Bi .................................. 320/103 |
| 2009/0175323 A1 | 7/2009 | Chung |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2010/0127804 A1 | 5/2010 | Vouloumanos |
| 2010/0159829 A1 | 6/2010 | McCormack |
| 2010/0202499 A1 | 8/2010 | Lee et al. |
| 2010/0231452 A1 | 9/2010 | Babakhani et al. |
| 2010/0283700 A1 | 11/2010 | Rajanish et al. |
| 2010/0285634 A1 | 11/2010 | Rofougaran |
| 2010/0297954 A1 | 11/2010 | Rofougaran et al. |
| 2011/0047588 A1 | 2/2011 | Takeuchi et al. |
| 2011/0181484 A1 | 7/2011 | Pettus et al. |
| 2011/0207425 A1 | 8/2011 | Juntunen et al. |
| 2011/0285606 A1 | 11/2011 | De Graauw et al. |
| 2011/0286703 A1 | 11/2011 | Kishimi et al. |
| 2011/0311231 A1 | 12/2011 | Ridgeway |
| 2012/0028582 A1 | 2/2012 | Tandy |
| 2012/0064664 A1 | 3/2012 | Yamazaki et al. |
| 2012/0083137 A1 | 4/2012 | Rohrbach et al. |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0217336 A1 * | 8/2013 | McCormack et al. ....... 455/41.2 |
| 2013/0266026 A1 * | 10/2013 | McCormack et al. ........ 370/474 |
| 2013/0266154 A1 * | 10/2013 | McCormack et al. ........ 381/117 |
| 2014/0170982 A1 * | 6/2014 | McCormack et al. ....... 455/41.2 |
| 2014/0273837 A1 * | 9/2014 | McCormack et al. ....... 455/41.1 |

OTHER PUBLICATIONS

USB Made Simple, MQP Electronics Ltd, 2006-2008 (78 pages).
Enumeration: How the Host Learns about Devices, Jan Axelson's Lakeview Research.
USB in a NutShell . . . (43 pages).
PCM510x 2VRMS DirectPath™, 112/106/100dB Audio Stereo DAC with 32-bit, 384kHz PCM Interface by Texas Instruments.
International Search Report & Written Opinion, May 3, 2013.
"Understanding the FCC Regulations for Low-Power Non-Licensed Transmitters", Office of Engineering and Technology, Federal Communications Commission, OET Bulletin No. 63, Oct. 1993.
Silicon Labs USB-to-I2S Audio Bridge Chip Brings Plug-and-Play Simplicity to Audio Design, Cision Wire, Feb. 4, 2013.
Bluetooth Headset, Jabra clipper, Jul. 28, 2010.
Philips, I2S Bus Specification, Jun. 5, 1996.
TN21065L_I2S, Interfacing I2S-Compatible Audio Devices to the ADSP-21065L Serial Ports, Apr. 1999.
Bluetooth Audio Dongle Receiver 3.5mm Stereo, Feb. 8, 2013.

* cited by examiner physical link contactless "replacement" link plastic cable

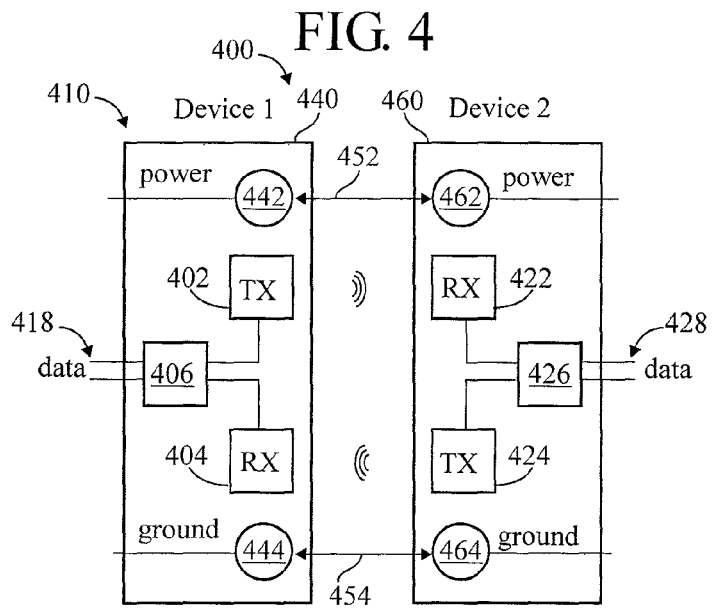
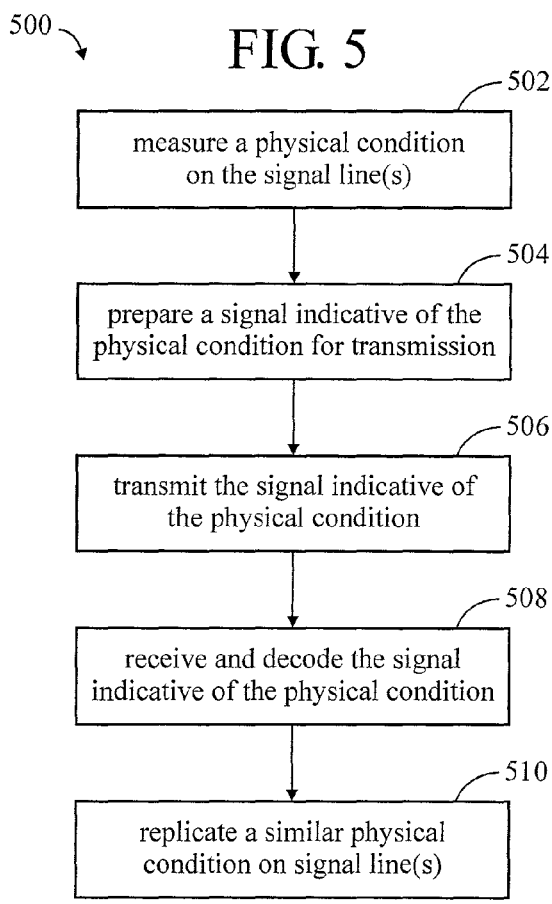

devices connected by a physical link devices connected by a wireless link
(source and destination are enabled for wireless)

devices connected via an adapter
(physical link with destination, wireless link with source)

Contactless Audio Dongle and Jack
(Dongle powered by Source)

power via contacts power via induction power via external supply

CONTACTLESS AUDIO ADAPTER, AND METHODS

CROSS-REFERENCE(S) TO RELATED APPLICATIONS

This is a continuation-in-part of U.S. Ser. No. 13/760,089 filed 6 Feb. 2013, incorporated by reference herein.

Priority is claimed from U.S. 61/605,981 filed 2 Mar. 2012, incorporated by reference herein.

This is a continuation-in-part of U.S. Ser. No. 13/427,576 filed 22 Mar. 2012 (now US 2012/0263244), which claims priority from U.S. 61/467,334 filed 24 Mar. 2011, incorporated by reference herein.

Priority is claimed from U.S. 61/661,756 filed 19 Jun. 2012, incorporated by reference herein.

This is a continuation-in-part of U.S. Ser. No. 13/713,564 filed 13 Dec. 2012, which claims priority from U.S. 61/570,707 filed 14 Dec. 2011, incorporated by reference herein.

This is a continuation-in-part of U.S. Ser. No. 12/655,041 filed 21 Dec. 2009 (US 2010/0159829), which claims priority from U.S. 61/203,702 filed 23 Dec. 2008, incorporated by reference herein.

TECHNICAL FIELD

This disclosure relates broadly to techniques for digital communication, particularly Standards-based interfaces, and also relates to systems incorporating said techniques.

BACKGROUND

Universal Serial Bus (USB) is an example of an interface "Standard" that defines the cables, connectors and communications protocols used in a bus for connection, communication and power supply between a "host" electronic device (such as a personal computer) or "hub" and various peripheral electronic devices such as keyboards, pointing devices, digital cameras, printers, portable media players, disk drives, network adapters, smartphones, and video game consoles.

Conventional USB interfaces uses electrical connectors and cables (with electrical wires) to interface from the host (alternatively a hub) device to peripheral devices. The connectors are mechanical in nature, and may wear down and eventually fail after repeated use. The existing mechanical connectors, which may be physically different for the host and peripheral devices, use electrical signaling contacts to communicate (transfer, transport data signals) from one device to another. These connectors must engage one another completely in order to ensure a good connection. The electrical signaling is also not ideal as it has many discontinuities in the wiring through the connector and wiring associated with the cable. This imposes an inherent limit on the speed of USB and increases the power budget for successfully transmitting signal over a significant distance. The length of a USB cable is practically limited (by cable delays, etc.) to approximately 5 meters. Power may be supplied via the USB connectors and cables to "bus-powered" peripheral devices. Current draw from the bus is normally limited to 100 mA or 500 mA.

Bluetooth is a wireless technology that allows a user to connect two Bluetooth-enabled devices, in a wireless process known as pairing, that eliminates the need for cabled connections between devices. Bluetooth can also be used to set up a wireless personal area network (WPAN). A USB-to-Bluetooth adapter inserts (plugs) into a USB port of a host device (such as a computer) which is not Bluetooth-enabled to provide Bluetooth functionality for the device.

Bluetooth headsets are known, and generally have electronics (circuitry, such as transceivers) for Bluetooth functionality (communicating wirelessly with Bluetooth-enabled host devices) in addition to conventional audio transducers (e.g., speaker, microphone). Bluetooth headsets cost much more than conventional headsets, and may thus be prohibitively expensive to ship with portable devices. Batteries are needed to operate the electronics, and this creates a larger form factor for the headsets as well as higher costs for both the manufacturer and the end user.

Bluetooth audio adapters are also known, which can be used with conventional headsets. The headset is plugged into the adapter, which communicates wirelessly with the Bluetooth-enabled host device. These adapters require power to operate, typically from internal batteries, which adds to their cost and weight. And, when the batteries are drained, the adapter no longer functions.

A signal is a physical quantity which varies with respect to time, space & contain information from source to destination. Electrical signals representative of audio data are discussed herein, and may be in analog or digital format. A digital-to-analog converter (DAC) is an electronic device that converts a digital signal to an analog signal. Conversely an analog-to-digital converter (ADC) is an electronic device that converts an analog signal to a digital signal. Electromagnetic (EM) signals are discussed herein, and may comprise a radio frequency (RF) carrier which may be modulated by an electrical signal provided to a transmitter (Tx), and conversely demodulated by a receiver (Rx) to generate an electrical signal. Typically, electromagnetic signals which are in the EHF (extremely high frequency) range of frequencies, such as from 30 to 300 gigahertz, or higher may be discussed herein.

I2S, also known as Inter-IC Sound, Integrated Interchip Sound, or IIS, is an example of a serial bus interface Standard (digital audio serial protocol) used for communicating digitized audio data between devices (or chips, or chips and devices). Typically, the bus comprises three (3) lines: a serial data line (SD) for two time-multiplexed data channels, a word select line (WS) and a continuous serial clock line (SCK).

SUMMARY

What is needed is a "replacement" communications interface for wired Standards-based interfaces such as USB that reduces or eliminates some of the problems associated therewith, while operating "transparently" within the constraints of the Standard.

It is a general object of the invention to provide improved techniques for communicating between electronic devices.

This object may generally be achieved by eliminating mechanical connectors and cable wires, using instead "contactless" (electromagnetic) connectors and an electromagnetic (EM) communications link (interface). Transceivers and transducers (antennas) for converting from electrical signals to electromagnetic (EM) signals may handle the communications between devices. Electrical conditions (such as voltage on differential signal lines) relevant to the successful operation of the Standard may be detected at a transmitting device and sent (such as out-of-band) over the electromagnetic (EM) interface to a receiving device. Arrangements for delivering power to a "bus-powered" downstream device are also disclosed. The techniques disclosed herein may be considered to be a contactless "replacement" for cabled Standards-based interfaces.

According to the invention, generally, a contactless, electromagnetic (EM), radio frequency (RF) communications link may be established between two or more electronic devices (one of which may function as a host or hub) which ordinarily communicate with one another via a Standards-based interface or wired (cable-connected) communications link or protocol (such as, but not limited to USB). A system may comprise many communications links connecting the host to many devices. The contactless link disclosed herein may link may replicate or emulate (or replace, or be substituted for) an existing wired communications link (such as, but not limited to USB) so as to be transparently substituted for at least one of the communications links in an overall system. This may include transporting data between devices, providing power to devices, communicating characteristics of devices to a hub or host, within the constraints (such as timing) of the protocol.

In the main hereinafter, a contactless communications link for replacing a USB link will be discussed, as exemplary of any of a number of Standards-based interfaces which may have one or more of their cabled communications links replaced by the contactless communications link disclosed herein. These Standards-based interfaces may include, but are not limited to PCIe, SATA, SAS, MHL, HDMI, DP, Ethernet, I2S, I2C, Thunderbolt, Quickpath, D-PHY, M-PHY, Hypertransport, and the like.

The solution presented herein solves the problem of transmitting native USB (as an example of any Standards-based protocol) over a contactless connector by converting electrical signaling conditions on a first USB device into an electromagnetic signal and transmitting the signal through a contactless connector to a receiver on a second USB device (which may be a host or hub). The second device converts the electromagnetic signal into electrical signals and replicates the electrical signaling conditions from the first device at the second device. By replicating (regenerating, recreating) the electrical conditions and operating within the timing constraints of the protocol, it may appear to the second device that the first device is physically connected (such as via an electrical cable and physical connectors) to the system bus.

The electromagnetic (EM) signal may be in the EHF range of frequencies, such as from 30 to 300 gigahertz, or higher. The EM signal may be propagated over a short distance, such as on the order of only one centimeter (1 cm). A dielectric medium, such as plastic, may be used to extend the range of the EM signal, such as beyond a few centimeters (cm) to many meters.

The conversion to and from electromagnetic (EM) signals occurs in a very short (sub ns) period of time. By replicating the electrical signaling conditions from the first USB device to the second USB device and doing so in a very short period of time, the contactless connector is invisible to both the first USB device and the second USB device and the devices behave as if they were connected electrically.

According to the invention, generally, a contactless, electromagnet (EM) replacement (substitute, alternative) for cabled (electric) Standards-based interfaces (such as, but not limited to USB) which effectively handles the data transfer requirements (such as bandwidth, speed, latency) associated with the Standard, and which is also capable of measuring and replicating relevant physical conditions (such as voltage levels) on data lines so as to function compatibly and transparently with the Standard. A contactless link may be provided between devices having transceivers. A non-conducting housing may enclose the devices. Some applications for the contactless (EM) interface are disclosed. A dielectric coupler facilitating communication between communications chips which are several meters apart. Conductive paths may provide power and ground for bus-powered devices.

According to some embodiments of the invention, a method of communicating data may comprise: at a first device, determining an electrical condition of a first set of signal lines carrying data, and transmitting an electromagnetic (EM) signal indicative of the electrical condition associated with the data; wherein the signal lines may be configured for transporting a Standards-based protocol which is designed for communicating electrical signals over a physical link. The first device may receive an electromagnetic signal indicative of a second electrical condition associated with data originated on second set of signal lines at a second device, and may replicate the second electrical condition at the first device. A second device may receive the electromagnetic signal indicative of the electrical condition and may replicate a similar electrical condition on a second set of signal lines. The first and second devices may be connected electromagnetically, rather than physically connected with one another, such as over an air gap or through one or more dielectric mediums, including through a dielectric cable, over an electromagnetic interface in an extremely high frequency (EHF) band, such as by modulating and demodulating a carrier having a frequency of at least 30 GHz (gigahertz). The electromagnetic signal may be transmitted within criteria established by a Standards-based protocol, and may be transmitted with an energy output below that of FCC requirements for transmitting an identification code. The device(s) may be enclosed with a non-conducting barrier which may also hermetically seal the device(s).

The Standards-based protocol may be selected from the group consisting of USB, PCIe, SATA, SAS, MHL, HDMI, DP, Ethernet I2S, I2C, Thunderbolt, Quickpath, D-PHY, M-PHY, Hypertransport, and the like.

According to some embodiments of the invention, a system for communicating data from signal lines configured for a Standards-based protocol which is designed for communicating electrical signals over a physical link may be characterized in that a first device may comprise: means for converting electrical signal inputs into electromagnetic (EM) signal outputs to support an extremely high frequency (EHF) contactless communication link; and means for determining an electrical condition of a first set of signal lines carrying data and for transmitting an electromagnetic (EM) signal indicative of the electrical condition associated with the data. The device may further comprise means for receiving an electromagnetic signal indicative of a second electrical condition associated with data originated on second set of signal lines at a second device, and for replicating the second electrical condition at the first device. The second device may comprise means for receiving the electromagnetic signal indicative of the electrical condition and replicating a similar electrical condition on a second set of signal lines. A non-conducting barrier may enclosing the device(s).

An audio adapter is disclosed for communicating over a contactless link (such as an anisotropic physical path) with a source device, and via a physical link (such as jack, plug and cable, alternatively a direct wired connection) with a destination device (such as a conventional headset). Power may be provided to the adapter from the source device, and may thereafter be provided by the adapter to the destination device. Constituent signals of a multi-wire standards-based electrical interface (such as I2S) may be encoded and combined into a single encoded digital stream for transport over the contactless link, and subsequently decoded and divided (separated) into replicas of the original constituent signals for the standards-based electrical interface.

According to some embodiments of the invention, an audio adapter for providing a communications link between a first device which comprises at least a source of electronic audio signals and a second device which comprises at least a destination for electronic audio signals, may comprise: means for communicating EHF signals contactlessly with the first device through a dielectric medium, and for converting between EHF signals and digital electrical signals; means for converting between digital electrical signals and analog electrical signals; and means for exchanging the analog electrical signals with the second device over a physical link. The adapter may further comprise means for receiving power from an external power source and for providing the power to at least one of the first and second devices.

According to some embodiments of the invention, a method of interfacing a first device comprising a source of electronic audio signals with a second device comprising a destination for electronic audio signals, may comprise providing an audio adapter for providing a communications link between the first and second devices and may be characterized by: with the audio adapter, communicating contactlessly at extremely high frequency (EHF) through a dielectric medium with the first device; and with the audio adapter, converting between digital electrical signals and analog electrical signals and exchanging the analog electrical signals with the second device over a physical link. At the audio adapter, power may be received from an external power source comprising one of the first device and an external power supply. The audio adapter may provide the power to the second device.

Some benefits or advantages to the communications interface techniques disclosed herein may include one or more of the following:
- transparent to USB and other protocols
- eliminates the need for mechanical connectors
- can be used in existing systems with existing interfaces such as USB and other protocols
- low latency
- low cost, semiconductor-based connector solution
- no software required
- high bandwidth (up to 10 Gbps and beyond)
- low power
- allows for new form factors while maintaining compatibility with existing Standards
- allows for completely enclosed devices
- provides superior ESD (electrostatic discharge) protection for Standard interfaces
- contactless connectors do not have to be touching and can move around relative to each other Energy output by the devices may be in the EHF band, below FCC requirements for certification or for transmitting an identification code which would otherwise interrupt data flow which eliminates the need to interrupt data flow to send such an ID. Reference is made to 47 CFR §15.255 (Operation within the band 57-64 GHz), incorporated by reference herein.

The invention(s) described herein may relate to industrial and commercial industries, such as electronics and communications industries using devices that communicate with other devices or devices having communication between components in the devices.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may be in the form of diagrams. Some elements in the figures may be exaggerated or drawn not-to-scale; others may be omitted, for illustrative clarity. Any text (legends, notes, reference numerals and the like) appearing on the drawings are incorporated by reference herein. When terms such as "left" and "right", "top" and "bottom", "upper" and "lower", "inner" and "outer", or similar terms are used in the description, they may be used to guide the reader to orientations of elements in the figures, but should be understood not to limit the apparatus being described to any particular configuration or orientation, unless otherwise specified or evident from context.

FIG. 4 is a block diagram illustrating a communications link of transceivers and power connectors between two devices.

FIG. 5 is a flowchart illustrating operation of an exemplary transceiver.

DETAILED DESCRIPTION

Figure 1:
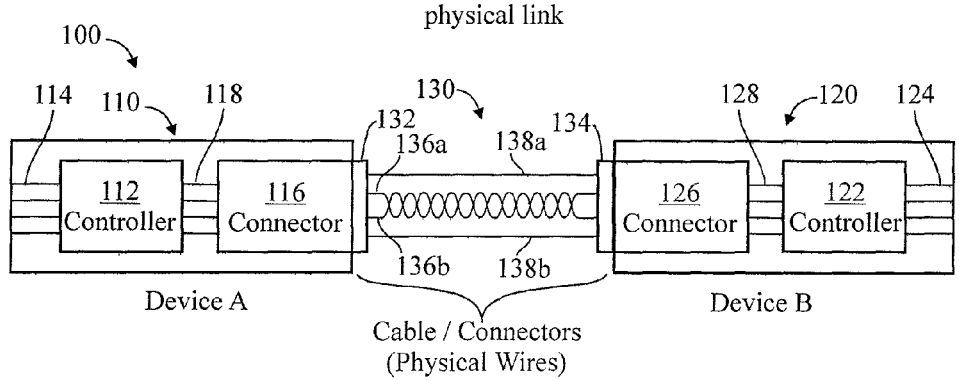
FIG. 1 is a generalized block diagram of a physical (wired) link implementing a Standards-based protocol, such as USB to connect devices (one of which may be a "host").

Various embodiments may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another.

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, well-known features may be omitted or simplified in order not to obscure the descriptions of the invention(s).

Reference herein to "one embodiment", "an embodiment", or similar formulations, may mean that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

In the following descriptions, some specific details may be set forth in order to provide an understanding of the invention(s) disclosed herein. It should be apparent to those skilled in the art that these invention(s) may be practiced without these specific details. In other instances, descriptions of well-known steps or components, may be described only generally, or even omitted, in order to not obscure the invention(s) being described. Headings (typically underlined) may be provided as an aid to the reader, and should not be construed as limiting.

Some Terminology

The following terms may be used in the descriptions set forth herein, and should be given their ordinary meanings unless otherwise explicitly stated or as may be evident from context.

The acronym "EHF" stands for Extremely High Frequency, and refers to a portion of the electromagnetic (EM) spectrum in the range of 30 GHz to 300 GHz (gigahertz).

The term "transceiver" (abbreviated "XCVR", or Tx/Rx) may refer to a device such as an IC (integrated circuit) including a transmitter and a receiver so that that integrated circuit may be used to both transmit and receive information (data). Generally, a transceiver may be operable in a half-duplex mode (alternating transmitting and receiving), a full-duplex mode (transmitting and receiving simultaneously), or both.

The term "contactless", as used herein, refers to implementing electromagnetic (EM) rather than electrical (wired, contact-based) connections and transport of signals between entities (such as devices). In some of the literature, the term "wireless" is used to convey this meaning. As used herein, the term "contactless" may refer to a carrier-assisted, dielectric coupling system which may have an optimal range in the near-field of the EM signal. The connection may be validated by proximity of one device to a second device. Multiple contactless transmitters and receivers may occupy a small volume of space. A contactless link established with electromagnetics (EM) may be point-to-point in contrast with a wireless link which typically broadcasts to several points.

The terms "Standards" (and "Standards-based"), as used herein, refer to communications interfaces and protocols such as, but not limited to, USB, PCIe, SATA, SAS, MHL, HDMI, DP, Ethernet, I2S, I2C, Thunderbolt, Quickpath, D-PHY, M-PHY, Hypertransport, and the like, any of which may have data format requirements and constraints, as well as being responsive to and creating physical conditions (such as voltage levels) upon a physical, electrical interface or communications link between electronic devices.

The terms, chip, die, integrated circuit (IC), semiconductor device, and microelectronic device, are often used interchangeably, in common usage, and may be used interchangeably herein. This also may include bare chips (or dies), packaged chips (or dies), and chip modules and packages.

Some functions described as being implemented by chips may be implemented as macro-functions incorporated into application specific integrated circuits (ASICS) and the like, and may alternatively be implemented, at least partially, by software running on a microcontroller. For example, "bit banging" is a technique for serial communications using software instead of dedicated hardware. Software directly sets and samples the state of pins on the microcontroller, and is responsible for all parameters of the signal: timing, levels, synchronization, etc. Bit banging may allow a given device to use different protocols with minimal or no hardware changes required.

With respect to chips, various signals may be coupled between them and other circuit elements via physical, electrically-conductive connections. Such a point of connection is may be referred to as an input, output, input/output (I/O), terminal, line, pin, pad, port, interface, or similar variants and combinations.

An Exemplary Standards-Based Physical Interface

FIG. 1 illustrates a physical communications link 100 between a first electronic device 110 and a second electronic device 120. The first device 110, for example, may be a personal computer (PC). The second device 120, for example, may be a computer peripheral (printer, keyboard, etc). A cable 130 is shown connecting the two devices with one another for transporting signals, electrically, between the two devices.

As used herein, the term "Physical Interface" means that signals (and optionally power) are transported between the devices electrically over wires (in a cable), and mechanical connectors may be used to connect the cable to the devices 110 and 120.

USB may be used throughout the descriptions set forth herein as an example of a Standards-based protocol. The USB bus is based on a so-called 'tiered star topology' in which there is a single "host" device and up to 127 "peripheral" devices. ("Hub" devices operate similar to host devices.) In this example, the first electronic device 110 may function as the "host" and the second electronic device 120 may be a representative peripheral device.

The first device 110 has a USB bus controller 112 connected to an internal (to the device 110) data bus 114 and manages the conversion of the data from a data bus 114 to an appropriate USB format. (If the controller 112 is implemented as a system on chip (SOC), the lines 114 may be internal to the controller 112.) The controller 112 includes transceivers (not shown). In a transmit mode, data in USB format is provided by the controller 112, via electrically conductive signal (data) lines 118 (such as traces on a printed wiring board), to a mechanical connector 116. (Two of the lines 118 may be for power and ground, and may originate other than at the controller 112.) In a receive mode, data in USB format is provided by the connector 116 to the controller over the signal lines 118.

The second device 120 has a USB bus controller 122 connected to an internal (to the device 110) data bus 124 and manages the conversion of the data from a data bus 124 to an appropriate USB format. (If the controller 122 is implemented as a system on chip (SOC), the lines 124 may be internal to the controller 122.) The controller 122 includes transceivers (not shown). In a transmit mode, data in USB format is provided by the controller 122, via electrically conductive signal (data) lines 128 (such as traces on a printed wiring board), to a mechanical connector 126. (Two of the lines 128 may be for power and ground, and may originate other than at the controller 122.) In a receive mode, data in USB format is provided by the connector 126 to the controller over the signal lines 128.

A cable 130 is provided for transporting signals (and optionally power), electrically, between the two devices 110 and 120. An "upstream" mechanical connector 132 is disposed at one end of the cable 130 and connects electrically with the connector 116 at the host device 110 A "downstream" mechanical connector 134 is disposed at the other end of the cable 130 and connects electrically with the connector 126 at the peripheral device 120. The cable 130 has a number of electrically conductive paths (typically wires), and establishes a physical (electrical) link between the first device 110 and the second device 120.

In an exemplary (pre-USB3.0) format, the cable 130 comprises a twisted pair of wires 136a and 136b (which may collectively referred to as "136") constituting a differential transmission pair of wires (designated "D+" and "D−"), and another pair of wires 138a and 138b (which may collectively be referred to as "138") for providing power (in USB, VBUS) and ground (GND), respectively for bus-powered peripheral devices). In USB3.0, two additional pairs of wires (super-speed transmitter SSTX and superspeed receiver SSRX differential pairs, not shown) and an additional ground (GND_DRAIN, not shown) are added to augment capability (greater bandwidth, etc.) of the physical link. The differential pair(s) of wires 136 conveying signals may be referred to hereinafter simply as "data lines", the other wires 138 may be referred to as "power lines". In the main hereinafter, pre-USB3.0 will be discussed as exemplary of a Standards-based physical link.

The USB specification defines four data speeds (transfer rates): LS/Low Speed (1.5 Mbit/s), FS/Full Speed (12 Mbit/s), HS/High Speed (480 Mbit/s), and SS/SuperSpeed (5 Gbit/s) data speed. These speeds are the fundamental clocking rates of the system, and as such do not represent possible throughput, which will always be lower as the result of the protocol overheads.

Transceivers (not shown) may be provided at both ends of a data link (in the hub or host, and in the connected device) for providing (transmitting) signals onto the data lines 138 (D+/D−), and detecting (receiving) signals from the data lines 138. A typical upstream end (end nearer the host) transceiver has two 15K pull-down resistors. When transmitting, each data line (D+ and D− can be driven low individually, or a differential data signal can be applied. When receiving, individual receivers on each line are able to detect single ended signals, so that the so-called Single Ended Zero (SEO) condition, where both lines are low, can be detected. There is also a differential receiver for reliable reception of data.

Enumeration is the term given to establishing what types of devices are connected to the USB bus, in terms of their characteristics, such as the data speed(s) of the device(s) that are connected to the bus (such as Low, Full, High, SuperSpeed). To function successfully, a device must detect and respond to any control request or other bus event at any time.

In an exemplary sequence of events, a user attaches a device to a USB port, or the system powers up with a device attached. The port may be on the root hub at the host or on a hub that connects downstream from the host. The hub detects the device, and monitors the voltages on the signal lines (D+ and D−) at each of its ports. The hub has a pull-down resistor of 14.25 k-24.8 kΩ on each line.

At the (peripheral) device end of the link a 1.5 kΩ (kilo-ohm) resistor pulls one of the data lines (D+ or D−) up to a 3.3V supply derived from VBUS. The "pull-up" resistor is applied to the D− line for a low speed device, and is applied to the D+ for a full speed device. (A high speed device will initially present itself as a full speed device with the pull-up resistor on D+.) The host can determine the required speed by observing which of the data lines (D+ or D−) is pulled high.

The above description of USB is provided merely as an example of a communication link that is a physical (wired) link, exchanges data between devices, and also imposes and detects physical conditions on the link which are indicative of characteristics of the devices relevant to efficient operation of the link (or bus). Other examples of similar (for purposes of the present disclosure) may include PCIe, SATA, SAS, MHL, HDMI, DP, Ethernet, I2S, I2C, Thunderbolt, Quickpath, D-PHY, M-PHY, Hypertransport, and the like.

Converting a Standards-Based Physical Interface to a Contactless Interface

A USB interface (communications link) has been described above as exemplary of a number of communications links which communicate over a physical interface of cables (wires) and electrical connectors.

Connector-replacement chips and some implementations of contactless (sometimes referred to as wireless) links have also been described. The techniques disclosed in the '829 and '244 publications are directed at converting electrical signals to electromagnetic (EM) signals, propagation characteristics for the EM signals, antenna design considerations and packaging features.

As mentioned above, the exemplary USB interface relies upon imposing and detecting physical conditions on the link which are indicative of characteristics of the devices relevant to efficient operation of the link (or bus). The USB Standard also imposes constraints, such as timing requirements, on transmission of signals.

It is an object of this disclosure to provide a contactless (EM) replacement (substitute, alternative) for cabled (electric) Standards-based interfaces (such as, but not limited to USB) which effectively handles the data transfer requirements and criteria (such as bandwidth, speed, latency) associated with the Standard, and which is also capable of effectively replicating the relevant physical conditions (such as measuring and imposing voltage levels on data lines, applying resistances to the data lines, providing power and ground to lines, etc.) and characteristics (such as protocol timing requirements, bus turnaround requirements) of the physical link being replaced.

By eliminating electrical connectors and cables, and transporting data using electromagnetics (EM), higher performance interfaces may be realized, while maintaining the benefits and capabilities of the underlying Standards-based protocol being replaced. The substitution of an electromagnetic (EM) link for the otherwise electrical one should be robust, flexible and versatile to handle protocols other than USB, including but not limited to PCIe, SATA, SAS, MHL, HDMI, DP, Ethernet, I2S, I2C, Thunderbolt, Quickpath, D-PHY, M-PHY, Hypertransport, and the like, some of which have similar problems which may be solved in similar ways.

The US 2010/0159829 ('829 publication) and US 2012/0263244 ('244 publication), for example, contemplated electrical signaling. U.S. 61/661,756 ('756 application) provides disclosure of a non-electrical medium ("plastic cable") capable of transporting electromagnetic (EM) signals (and, additionally, some electrical signals) a considerable distance (up to kilometers, and more).

By using electromagnetics (EM) rather than electrical cables and connectors to establish the data link, many of the problems associated with the physical implementation of the link may be avoided, such as mechanical wear, customer returns due to broken connectors, as well as bandwidth (data transfer rate) and limitations on the length of the link. Moreover, the use of an EM link rather than electrical cabling allows devices to be completely sealed, such as against environmental factors, including ESD (electrostatic damage).

Additionally, limitations inherent in the physical interface being replaced (such as signal degradation at discontinuities in a physical signal path, such as from chip-to-PCB, PCB-to-connector, connector-to-cable, which may act as low pass filters) may be avoided, and consequently data transfer rates may be higher, bandwidth may be increased, and the length (range) of the link may exceed that of the physical interface being replaced.

Previous attempts to solve the problem(s) associated with physical interfaces have involved wireless communications, such as WiFi or WiGig, better connector and conductor technologies, equalization to improve the signaling, and complex signaling schemes to improve the bandwidth and S/N ratio. These attempts may have the following negative attributes:

WiFi: Higher power, Higher cost, lower bandwidth, long latency, software complexity WiGig: Higher power, Much higher cost, low bandwidth relative to USB3, long latency, software complexity Generally, all wireless technologies are fundamentally insecure, because they broadcast their communications signals, allowing interception by unauthorized users, therefore typically requiring encryption which increases the latency of the connection.

Better Connectors: Higher cost, still have mechanical and return issues, performance is still limited The techniques disclosed herein may be implemented with integrated circuits (ICs) using standard CMOS (Complementary-Metal-Oxide-Semiconductor) processes. The ICs may convert a standard USB input (USB, USB2, USB3) into a electromagnetic (EM) carrier. This conversion may be done with very low latency such that it may be transparent to the underlying protocol. The electromagnetic (EM) signal may be in the EHF (Extremely High Frequency) band, or higher, and may be propagated through air, or conducted through plastic waveguides and/or directed using reflective materials. The EM carrier may be generated in one device or peripheral and may be transmitted through a short distance of air to the receiver in a companion device or peripheral.

Conventional Standards-protocols such as USB use electrical signals to communicate between two devices. The electrical signals may be at different levels indicating logical values such as "1" or "0". The electrical signals may also include many other characteristics such as termination resistance, drive strength, status/configuration, and drive type. Some of these characteristics are used in USB and similar other protocols for functions such as enumeration, power state information, or whether a device is connected or not.

One design challenge of the "contactless" USB (or similar other protocol) interface is to appear transparent to existing USB devices and peripherals. In order to accomplish this, the electrical levels, characteristics, and conditions must remain largely the same between the two devices even though they are not physically connected. The contactless solution presented here replicates those conditions at both devices by measuring and capturing the current electrical conditions associated with the data and transmitting (conveying) those conditions from one device to the other.

At the receiving device, the electrical conditions may be recreated so that the two USB devices have similar electrical conditions on their inputs and outputs as if they had been physically connected. In some implementations, the receiver may deduce (infer, determine) the appropriate electrical conditions based on the current state of the electrical interface at the receiver, the current state of a state machine at the receiver, and/or data that is being transmitted or received over the electromagnetic (EM) interface, or combinations thereof. Therefore, in some cases, the transmitter may only need to transmit a subset (or a representation) of the electrical conditions present at the transmitter. In some implementations, the subset (or representation) may be reduced to the logical level (logic "1" or logic "0") of the electrical interface. The state machine may track the current mode or state of operation of the transmitter or the receiver. This may be used in conjunction with the actual electrical conditions at the transmitter or the receiver, or with data received over the electromagnetic interface to generate the appropriate electrical conditions at the receiver.

Generally, an electromagnetic (EM) link may replace an electrical (wire) link such as USB and similar protocols (Standards-based interfaces) to connect two (or more) devices, one of which may be a host or hub, the other(s) of which are "connected devices". In addition to performing data transfer between the devices, electrical characteristics and conditions relevant to operation of the protocol such as line voltages, termination resistance, drive strength, status/configuration, and drive type may be measured at one device, then transmitted to and recreated at another device, such as a hub or host. The conversion from electrical to electromagnetic (EM), and transmission of data and electrical conditions may be may be done with very low latency so as to be transparent to the underlying protocol. In some implementations, the receiver may deduce (infer, determine) the appropriate electrical conditions based on the current state of the electrical interface at the receiver, the current state of a state machine at the receiver, and/or data that is being transmitted or received over the electromagnetic (EM) interface, or combinations thereof, as described above.

The two devices can communicate to each other without a physical connection and can also communicate over a dielectric medium. The devices can be protected using a non-conducting medium, thus affording supplier ESD protection to Standards-based interfaces.

Another challenge is the enumeration phase of many of the Standards such as USB. In the enumeration phase, some electrical characteristics and conditions are tested and measured by the host (Device A) or connected device (Device B). These electrical characteristics and conditions may determine the type or mode of operation of the Standards-based interface. It may be important that the conditions on both sides of the link be largely similar. This invention allows for the correct and proper enumeration of Standards-based interfaces even though they are not connected by replicating the electrical characteristics and conditions on both sides of the link.

The invention also provides transparency to Standards-based protocols by transmitting and receiving the electrical characteristics and conditions in a very small (such as sub-nanosecond) period of time which the contactless interface to appear (such as to USB controllers which have tight timing constraints) as if it were directly (physically) connected. Transparency may be provided by transmitting or by receiving the electrical characteristics, and reproducing (recreating, replicating, duplicating) the electrical conditions based on simple states. This can be done at the transmitter, at the receiver, or both.

Connector-Replacement Chips

US 2010/0159829 (the '829 publication), incorporated in its entirety by reference herein, discloses tightly-coupled near-field communication-link devices, referred to therein as "connector-replacement chips". Tightly-coupled near-field transmitter/receiver pairs are deployed such that the transmitter is disposed at a terminal portion of a first conduction path, the receiver is disposed at a terminal portion of a second conduction path, the transmitter and receiver are disposed in close proximity to each other, and the first conduction path and the second conduction path are discontiguous with respect to each other. In this manner, methods and apparatus are provided for transferring data through a physically discontiguous signal conduction path without the physical size and signal degradation introduced by a signal-carrying mechanical connector, and associated cabling. The '829 publication references U.S. Pat. No. 5,621,913 (Micron, 1997), which is also incorporated in its entirety by reference herein.

The '829 publication shows (FIG. 12 therein) a high-level block diagram of the transmit path of a near-field transmitter. An equalizer receives an input signal and compensates for strip-line loss; an EHF carrier generator, either free-running or locked to a reference extracted from the data input, is coupled to a modulator; and an antenna interface is coupled to the modulator, the antenna interface typically including an impedance matching network and a final output driver coupled to an antenna.

The '829 publication shows (FIG. 13 therein) a high-level block diagram of the receive path of a near-field receiver. An antenna is coupled to a receiver that has sufficient sensitivity and signal-to-noise ratio to maintain an acceptable bit-error-rate; the receiver is coupled to an EHF local oscillator and to a demodulator. The demodulator is coupled to a line-driver that provides equalization appropriate for the desired data rate.

US 2012/0263244 (the '244 publication), incorporated in its entirety by reference herein, discloses integrated circuit with electromagnetic communication. A system for transmitting or receiving signals may include an integrated circuit (IC), a transducer operatively coupled to the IC for converting between electrical signals and electromagnetic signals; and insulating material that fixes the locations of the transducer and IC in spaced relationship relative to each other. The system may further include a lead frame providing external connections to conductors on the IC. An electromagnetic-energy directing assembly may be mounted relative to the transducer for directing electromagnetic energy in a region including the transducer and in a direction away from the IC. The directing assembly may include the lead frame, a printed circuit board ground plane, or external conductive elements spaced from the transducer. In a receiver, a signal-detector circuit may be responsive to a monitor signal representative of a received first radio-frequency electrical signal for generating a control signal that enables or disables an output from the receiver.

The '244 publication discloses that tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In exemplary versions, the transmitter and receiver may be disposed on separate circuit carriers positioned with the antennas of the transmitter/receiver pair in close proximity.

The '244 publication discloses that a transmitter or receiver may be configured as an IC package, in which an antenna may be positioned adjacent to a die and held in place by a dielectric or insulating encapsulation or bond material. A transmitter or receiver may be configured as an IC package, in which an antenna may be positioned adjacent to a die and held in place by encapsulation material of the package and/or a lead frame substrate. Examples of EHF antennas embedded in IC packages are shown and described.

An Exemplary Contactless Communications Link

Figure 2:
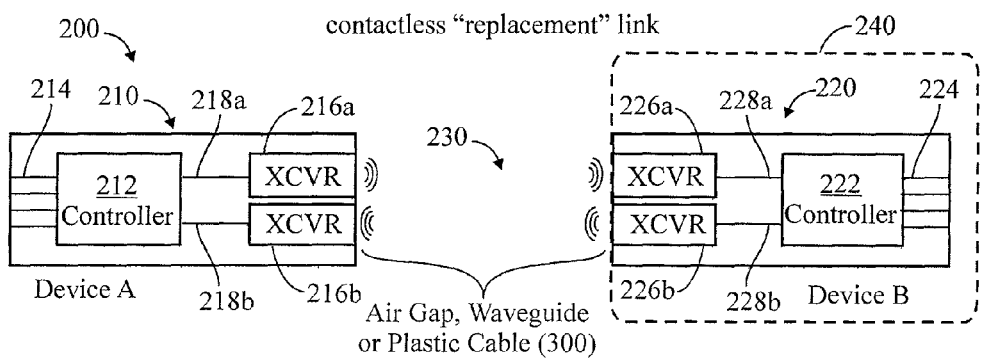
FIG. 2 is a generalized block diagram of a contactless link for replacing at least some of the functionality of the physical link shown in FIG. 1, connecting the devices via electromagnetics (EM).

FIG. 2 shows a basic implementation of a system comprising a "contactless" link 200 which may serve as a "replacement" for the physical link 100 between a first device 210 (compare 110) and one (or more) second devices 220 (compare 120). The contactless link 200 may be implemented so as to be transparent to a Standards-based communications protocol, such as (but not limited to) USB. As used herein, the term "Contactless Interface" means that signals flowing between the devices 210 and 220 occurs electromagnetically over a non-electrical medium 230 such as an air gap, waveguide or plastic, for example, as discussed in greater detail hereinbelow. (The electromagnetic communication over an air gap may be limited to a short range, such as 1-5 cm. The use of a dielectric medium such as a plastic cable, described in greater detail hereinbelow, may extend the range significantly, such as many meters.) In the main, hereinafter, data flow from the device 210 to the device 220 may be described, as representative of data flow in either direction (i.e., including data flow from the device 220 to the device 210). It should be understood that in this, and any other embodiments of contactless links discussed herein, an overall communications may be implemented as a combination of contactless and physical links.

The first device 210 has a USB bus controller 212 (compare 112) connected to an internal data bus 214 (compare 114) and manages the conversion of data from the data bus 214 to an appropriate USB format onto a set of data (signal) lines 218a and 218b (which may collectively be referred to as "218"). Only two data lines 218 are shown, and may be representative of USB "D+" and "D−" differential signal lines. The signal lines 218 (and 228) are configured for transporting a Standards-based protocol, such as, but not limited to USB. (USB is referenced merely as an example of a Standards-based protocol. In FIG. 1, VBUS and GND lines were also illustrated. The signal lines 218 may be transporting any Standards-based protocol, such as USB, PCIe, SATA, SAS, I2S, etc. It may be noted that in USB-3, and other similar protocols, Tx and Rx may be provided as two separate sets of data lines.) Depending on the protocol being "converted" for electromagnetic transmission (and reception), there may be several more data lines 218. The terms "data lines" and "signal lines" may be used interchangeably herein, unless otherwise dictated by context. If the controller 212 is implemented as a system on chip (SOC), the lines 214 may be internal to the controller 212.

The first device 210 is shown having two transceivers ("XCVR") 216a and 216b (which may collectively be referred to as "216") connected to the data (signal) lines 218a and 218b, respectively. These transceivers 216 will take the electrical signals from the data lines 218 and convert them to electromagnetic (EM) signals, such as in the manner described in the '829 and '244 publications, functioning as "connector replacement chips", so that the electrical signals of a Standards-based protocol may be converted to electromagnetic (EM) signals and conveyed between the two devices 210 and 220, via the non-electrical medium 230. Pulse Code Modulation (PCM) may be employed to modulate the data onto the carrier, using PCM encoders and decoders (not shown). Out-of-band (OOB) signaling may be used to convey information other than the data between the two devices 210 and 220, over the medium 230. Antennas associated with the transceivers are omitted, for illustrative clarity (they are discussed in detail in the '829 and '244 publications).

In a manner similar to the first device 210, the second device 220 (compare 120) has a USB bus controller 222 (compare 122) connected to an internal data bus 224 (compare 124) and manages the conversion of data from the data bus 224 to an appropriate USB format onto a set of data lines 228a and 228b (which may collectively be referred to as "228"). Again, only two data lines 228 are shown, and may be representative of USB "D+" and "D−" differential signal lines. And the second device 210 is shown having two transceivers ("XCVR") 226a and 226b (which may collectively be referred to as "226") connected to the data lines 228a and 228b, respectively, for receiving electromagnetic (EM) signals from the non-electrical medium 230 and converting them to electrical signals which are conveyed to the controller 222 over the data lines 228. If the controller 222 is implemented as a system on chip (SOC), the lines 224 may be internal to the controller 222.

Data transport may be provided (for example) by a synchronous one-bit interface, where the transceivers 214 and 224 strobe single bits in and out in response to a clock signal within the timing constraints of the Standards-based interface (such as, but not limited to USB). Communication between the devices 210 and 220 may be half-duplex or full duplex. And, for USB, generally (again, by way of example only) the transactions between devices may be at Low Speed (LS), Full Speed (FS), High Speed (HS) or SuperSpeed (SS).

In a broad sense, the transceivers 214 and 224 can be thought of as performing a function similar to that of repeaters. (A repeater is an electronic device that receives a signal and retransmits it at a higher level or higher power, or onto the other side of an obstruction, so that the signal can cover longer distances.) However, repeaters are designed to receive a signal and re-transmit it in the same format. In contrast therewith, using the techniques disclosed herein, the communications devices (transceivers 216 and 218) are capable of receiving signals from wires, in an electrical format, and converting/transmitting them in an electromagnetic (EM) format, such as in the EHF band, which may facilitate a data rate greater than or equal to 1 Gbps. (The transceivers of course enable the reverse situation—receiving signals in EM format and converting them to an electrical format for insertion on a physical data bus.)

A dashed line 240 is shown around the device 220, as exemplary of a non-conducting barrier (housing, enclosure, or the like), such as of plastic or acrylic, enclosing the chips (communications devices, transceivers) and or the device (PC, etc) they are in. (This would apply as well to the device 210.) Electromagnetic (EM) radiation may pass easily through the barrier 240, but electrical current cannot pass easily through the barrier 240. The barrier 240 can therefore isolate circuit board and fragile chips from ESD (electrostatic discharge). The barrier 240 may also hermetically seal the device. The barrier 240 may additionally provide a benefit to devices such as cell phones, for example protecting them from moisture and humidity. The electromagnetic interface (EM) techniques disclosed herein may completely eliminate the need for any mechanical connectors (other than, perhaps a jack for recharging an internal battery) or other openings in the device.

In addition to simply transporting the data, the Standards-based interface may depend upon actual physical characteristics of the interface to operate efficiently. For example, the USB protocol discusses the use of resistors to establish certain voltage levels, selectively, on the data lines (D+/D−) to indicate and initiate different modes of operation. In other words, it may not be sufficient to simply convert the data signals from an electrical format to an electromagnetic format and transmit them (bit-for-bit) over the electromagnetic medium, it may also be important to replicate various electrical conditions of the communication system in order for the process to function effectively and "transparently".

In order to accomplish the objective of replicating the physical conditions of the transmission (data) lines, components may be included in the transceivers 214 and 224, or provided separately, to measure at least one physical condition (such as, but not limited to voltage level) of at least one of the data lines 218 or 228 in one of the devices 210 or 220, and provide a signal indicative of the measured condition to the respective transceiver for transmission (such as OOB) to the other of the devices 210 or 220, so that a similar physical condition can be replicated on a corresponding data line 218 or 228 in the other device. In some implementations, the receiver may deduce (infer, determine) the appropriate electrical conditions based on the current state of the electrical interface at the receiver, the current state of a state machine at the receiver, and/or data that is being transmitted or received over the electromagnetic (EM) interface, or combinations thereof, as described previously.

As mentioned above, some peripheral devices may be "bus-powered", deriving their operating current from the physical (electrical) communications link (in USB, the cable). Having "replaced" the physical/electrical communications link (130) with an electromagnetic (EM) link 230, power and ground may be included other than electromagnetically, as described in greater detail below.

Dielectric Couplers for EHF Communications

U.S. 61/661,756 ('756 application) discloses devices, systems, and methods for EHF communications, including communications using dielectric guiding structures and beam focusing structures.

Figure 3:
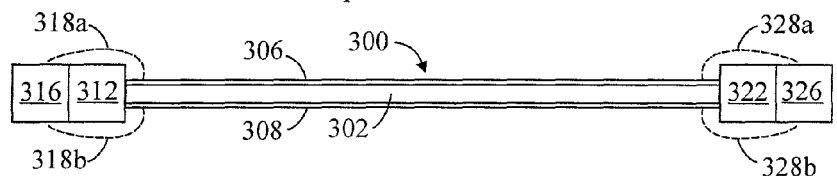
FIG. 3 is a diagram illustrating an electromagnetic (EM) communications link operating over a "plastic cable".

FIG. 3 shows a dielectric coupler 300 for facilitating propagation of polarized EHF-frequency signals may include an elongate strip of dielectric material (medium) 302 such as plastic, glass, rubber or ceramic, and may have a rectangular cross section and two ends. The dielectric medium may be referred to as a "plastic cable", and may function as the non-electrical medium 230. Suitable plastic materials for the dielectric medium 302 may include, but are not limited to, PE (polyethylene), acrylic, PVC (polyvinylchloride), ABS (Acrylonitrile-Butadiene-Styrene), and the like In its signal-conveying capacity (as a signal path), the plastic cable may be considered to be a "virtual wire". Stacked or layered dielectric coupler structures may enable multiple signal paths, such as to be substituted for the exemplary twisted pair of physical wires in the exemplary USB bus.

The dielectric coupler 300 may facilitate communication between communications chips (transceivers) 316 and 326 (compare 216 and 226) at a transmission source and a transmission destination, respectively. A transmit transducer 312 operatively coupled with the communication chip 316 may be disposed at one end of the dielectric coupler 300. A receive transducer 322 operatively coupled with the communication chip 326 may be disposed at the other end of the dielectric coupler 300. These transducers (or antennas) 312 and 322 may be disposed adjacent ends of the dielectric medium 302, in close proximity thereto, and coupled thereto via a dielectric horn (or lens) or an interface dielectric. The antennas may be embedded in the ends of the dielectric medium.

An EHF-frequency signal may be launched into the coupler 300 from the transmit transducer 312 at the transmitter end, propagating down the long axis of the coupler 300 and out the other end, where it is received by the receive transducer 322. The dielectric coupler 300 may be flexible, and may include a connector element or fastener at one or both ends for connecting the coupler to one or more devices associated with the transmitting and receiving communications chips (transceivers) 316 and 326.

A dielectric coupler may include dielectric portions made of plastic or other materials having a dielectric constant of preferably at least about 2.0. Materials having higher dielectric constants may result in reduction of required dimensions due to a reduced wavelength of the signal in that material. The dielectric material of the plastic cable that may be at least partially coated in a layer having a low dielectric constant or an electrically conductive layer to facilitate propagation, reduce interference, or to reduce the likelihood of shorting the signal being propagated down a long axis of the coupler.

The dielectric medium 302 may function as a transmission medium (such as waveguide), and the EHF carrier may propagate along a long axis of the dielectric medium, maintaining a single polarization direction. An outer surface of the dielectric medium may be coated or covered with a conductive material (metal). The metal may isolate the dielectric medium from external interference, and may serve as a conductive path for electrical signals and/or power. Two or more metallizations (conductive paths) 306, 308 may extend along the length of the dielectric medium 302, such as for electrical shielding, or for conveying power (in USB terminology, VBUS) and ground (GND). Stacked or layered structures may enable multiple signal paths.

FIG. 3 is illustrative of a system comprising devices communicating electromagnetically, through one or more dielectric mediums, which may include for example different plastic materials which may include housings (240) for the device (s), as well as air (compare 230, FIG. 2).

The communications chip (transceiver) 316 may have electrical connections 318a and 318b (which may collectively be referred to as "318", shown as dashed lines) for connecting with the individual metallizations 306 and 308 on the dielectric medium 302. The communications chip (transceiver) 326 may have electrical connections 328a and 328b (which may collectively be referred to as "328", shown as dashed lines) for connecting with the individual metallizations 306 and 308 on the dielectric medium 302. These electrical connections 316/318 and 326/328 may supply power and ground such as from a host device, along the link, for operating a bus-powered device. The conductive paths 306 and 308 may provide power and ground (compare 138a and 138b) for bus-powered devices.

For some applications, the communications chips 316 and 326 (with appropriate transducers, compare 312 and 322, respectively) may communicate directly with one another, over shorter distances, as described in the '829 and '244 publications, without a coupler 300. Separate electrically conductive paths (compare 318 and 328) may be provided to power bus-powered devices.

Some Embodiments

Transceivers (216a/b, 316) were mentioned above, capable of converting electrical signal inputs into electromagnetic (EM) signal outputs to support an extremely high frequency (EHF) contactless communication link.

FIG. 4 shows a system comprising a half-duplex communications link 400 between two devices 410 (compare 210) and 420 (compare 220). A first device 410 receives an electrical signal (data) on a signal line(s) 418 (compare 218). The data signal is encoded, such as using pulse code modulation (PCM), and is provided to a transmitter (Tx) 402 which transmits the encoded data signal as an electromagnetic (EM) signal, such as in the EHF range. The EM signal is received at a receiver (Rx) 424 of a second device 420, decoded, and provided as an electrical signal (data) on a signal lines 428 (compare 228). In the reverse direction, the second device 420 receives an electrical signal (data) on the signal line(s) 428. The data signal is encoded, such as using pulse code modulation (PCM), and is provided to a transmitter (Tx) 422 (compare 402) which transmits the encoded data signal as an electromagnetic (EM) signal, such as in the EHF range. The EM signal is received at a receiver (Rx) 404 (compare 424) of the first device 410, decoded, and provided as an electrical signal (data) on the signal line(s) 418.

In the first device 402, a block 406 represents circuitry capable of detecting (measuring) a physical condition (such as voltage level) on the signal line(s) 418, generating an electrical signal indicative thereof, and causing that signal to be encoded. The encoded signal may be transmitted, such as out-of-band (OOB), by the transmitter 402 along with the aforementioned data as an electromagnetic (EM) signal to the second device 420. At the second device 420, the signal indicative of the physical condition of the signal line 418 is received, converted to an electrical signal, decoded, and provided to a block 426 which represents circuitry capable of replicating a similar physical condition on the signal line(s) 428.

In the reverse direction, in the second device 420, the block 426 represents circuitry capable of detecting (measuring) a physical condition (such as voltage level) on the signal line(s) 428, generating an electrical signal indicative thereof, and causing that signal to be encoded. The encoded signal may be transmitted, such as out-of-band (OOB), by a transmitter (Tx) 422 (compare 402) along with the aforementioned data as an electromagnetic (EM) signal to the first device 410. At the first device 410, the signal indicative of the physical condition of the signal line(s) 428 is received, converted to an electrical signal, decoded, and provided to the block 406 for replicating a similar physical condition on the signal line(s) 418.

The blocks 406 and 426 may perform the functions of detecting a physical (electrical) condition such as voltage level on signal lines 418 and 428, respectively, and imposing a similar physical (electrical) condition such as voltage level on the signal lines 428 and 418, respectively.

Additionally, protocol states may be tracked at the transmitter and the receiver. For example, combining the protocol state with the electrical state at the transmitters (Tx) to encode the complete electrical state of an incoming signal. And, similarly, to recreate the complete electrical signal at the receivers (Rx).

When initializing, the protocol state can be tracked on both sides of the link. An initial baseline (starting) protocol state may be established, before detecting the physical condition. This may be based on protocol negotiation at the beginning of a communication session, such as information concerning speed, capabilities, drivers and the like. Thereafter, the state and condition can be updated, in real time, based on what is being measured and received. The state may also change after a reset, or the like.

The transceivers may be enabled to detect a link partner while dissipating minimal power. For example, the transmitter (Tx) may be powered up periodically with a low duty cycle and set to send a constant '1' via a low-speed mode, then put to sleep. The receiver (Rx) may be powered up periodically with a low duty cycle and set to listen for the beacon. The receiver cycles should be such that the receiver power-on period spans at least two Tx beaconing cycles. The duty cycle of both Tx and Rx must be such that the average current draw is <1 mA (implies a 1/100th or lower duty cycle).

Energy output by the transmitters (TX) 402 and 422 may be in the EHF band, below FCC requirements for transmitting an identification code which would otherwise interrupt data flow. Reference is made to 47 CFR §15.255 (Operation within the band 57-64 GHz), incorporated by reference herein.

The transceiver may be a half-duplex transceiver which can asynchronously convert a baseband signal into a modulated EHF carrier which is radiated from an internal antenna, or can receive and demodulate the carrier and reproduce the original baseband signal.

The transceiver may comprise baseband input, output and signal conditioning circuitry ("Baseband blocks"), EHF generation, modulation, reception and demodulation circuitry ("RF Blocks"), Control I/Os and logic ("Control blocks") and Power Conditioning circuitry ("Power Blocks").

The transceiver may feature two operating modes: a high-speed mode, intended for use with DC-balanced differential signals, is suitable for signals running from 100 Mb/s to 6.0 Gb/s and features support for envelope-based Out-of-Band (OOB) signaling used in Serial-Attached-SCSI (SAS) and Serial Advanced Technology Attachment (SATA), as well as electrical idle and Low-Frequency Periodic Signaling (LFPS) signals in PCI-Express (PCIe) and Universal Serial Bus version 3.0 (USB 3.0). Equalization for lossy PCB traces leading to and away from the device is included. Application information for this mode can be found in section 6.1.

The transceiver may be implemented as a chip comprising a transmitter (Tx), a receiver (Rx) and related components. The transceiver chip may use an EHF carrier, at 30-300 GHz, such as 60 GHz carrier frequency. Transmit power and receive sensitivity may be controlled to minimize EMI (electromagnetic interference) effects and simplify FCC certification. The EHF carrier may penetrate a wide variety of commonly-used non-conductive materials (glass, plastic, etc.).

In its transmit mode, the transceiver may operate functionally as a rate- and protocol-transparent high-gain non-inverting buffer. The true differential inputs, such as from a USB bus, may be terminated on die with 100Ω from true to complement and incorporate optional equalization to counter high-frequency attenuation typical of PCB traces.

In its receive mode, the transceiver may operate functionally as a high-gain non-inverting buffer. The true differential outputs are source terminated on die with 50Ω per side and similarly incorporate optional equalization to counter high frequency attenuation typical of PCB traces. A signal detect function incorporated into the receiver (Rx) may provide a means of qualifying the strength of the received signal as being sufficient to receive error-free data through the high-speed data path.

The transceiver may establish a low-latency protocol-transparent communication link supporting data rates up to 6.0 Gb/s, or higher. The link may be obtained through close-proximity coupling between two transceiver chips, or over longer distances using a plastic cable (such as 300), or the like. The transceiver chip features wide flexibility in the relative orientation and spacing between the respective devices, thereby allowing operation across a broad range of placements.

Some features or characteristics of the transceiver may include:
  Fully asynchronous signal path, less than 0.5 ns latency
    100 Mb/s to 6.0 Gb/s bandwidth in a high-speed mode
  Differential high-speed transmitter input, 100Ω differential termination with switchable common-mode impedance for USB-SS and PCIe Receive-detect compatibility
  Signal detect output and muting of receive output on loss of signal
  Support for Out-of-Band (OOB) signaling for SATA and Low-Frequency periodic Signaling (LFPS) for USB-SS and PCIe The transceiver chip may be packaged in a conventional manner, such as in ultra-miniature BGA format. The antenna may be integrated into the package, or may be external to the package, or may be incorporated onto the chip itself (such as in the manner of U.S. Pat. No. 6,373,447).

An exemplary communications module may comprise two or more transceiver chips, a CPLD (complex programmable logic device) or low-density FPGA (field-programmable gate array), a regulator, and a small number of additional discrete components, such as:
  Programmable 1.5K pull-up on at least 1 but preferably 2 of the IO—otherwise need to use an additional I/O in series with an external resistor
  Precision comparator capable of comparing voltages against a reference
  Device side may have a 1.5K (+/−5%) Ohm pullup resistor on D+
  Host side may have a 15K (+/−5%) Ohm pulldown resistor on both D+ and D−

Power and ground may be supplied by the first device 402 to the second device 412 over a physical link providing an electrical (conductive) path between the two devices. For example, a connector 440, represented by the box drawn around the components 402, 404 and 406 may be associated with the first device 410, such as mounted to a surface of the device 410 or at the end of a cable (not shown) extending from the device 410. Power (such as Vbus) and ground (such as GND) may be supplied to the connector 440, more particularly to corresponding two metallic (and electrically conductive) magnets 442 and 444, respectively, disposed within the connector 440. A connector 460, represented by the box drawn around the components 422, 424 and 426 may be associated with the second device 420, such as mounted to a surface of the device 420 or at the end of a cable (not shown) extending from the device 420. Power (such as Vbus) and ground (such as GND) may be received by the connector 460, more particularly by corresponding two metallic (and electrically conductive) ferrous elements such as buttons 462 and 464, respectively, disposed within the connector 460. The two-headed arrows 452 and 454 represent conductive paths (compare 306, 308) between the two devices 440 and 460. In this manner, in addition to communicating data electromagnetically (EM), the device 410, such as a personal computer (PC) or laptop, functioning as a host, may provide power to a connected device 420, such as a scanner, webcam or the like.

FIG. 5 illustrates an exemplary method 500 of communicating data between two devices, such as the devices 210 or 410 and 220 or 420. The method is described in a greatly simplified manner, for illustrative clarity, as a sequence of steps.

In a first step 502, a given device (210, 410) determines (measures) a physical (typically electrical) condition, such as voltage level, on one (or both) of the differential signal lines (218, 418) associated with the given device (210, 410). As mentioned above, the physical condition may relate to how data may be exchanged between the two devices, such as may pertain to speed an timing constraints.

In a next step 504, the given device (210, 410) prepares (encodes) a signal indicative of the measured physical condition for transmitting to the other device. As mentioned above, this transmission may accompany the transmission of data, and may for example be transmitted out-of-band (OOB).

In a next step 506, the given device (210, 410) transmits the signal indicative of the measured physical condition to the other device (220). As mentioned above, transmission may occur over an air gap, waveguide, or plastic cable (300).

In a next step 508, the other device (220, 420) receives and decodes the signal indicative of the measured physical condition and determines (such as using a lookup table) a similar physical (typically electrical) condition to be applied on one (or both) of the differential signal lines (228, 428) associated with the other device (220, 420).

In a last step 510, the other device (220, 420) replicates the similar physical condition on one (or both) of the differential signal lines (228, 428) associated with the other device (220, 420).

Some Exemplary Deployments

Figure 6A:
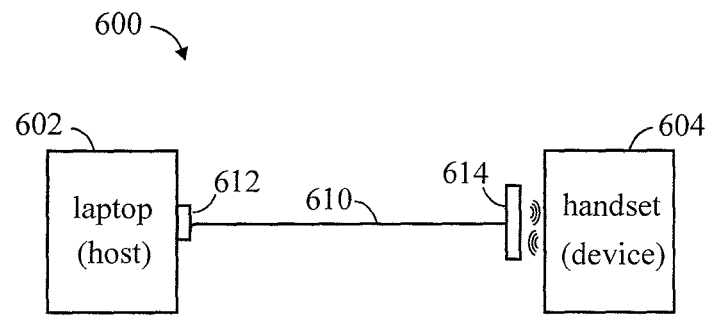
FIGS. 6A, 6B are diagrams illustrating exemplary deployment modes.

FIG. 6A shows an exemplary application (deployment) 600 for some of the communications system techniques described herein, wherein a first device which may be a computer (host) 602 is connected (linked) with a second device 604 which may be a handset (such as a mobile telephone). A cable 610 has a mechanical (electrical) connector 612 (such as USB Type-A) at one of its two ends for for plugging into a corresponding jack (not shown) on the computer 602. This establishes an electrical connection with the computer 602 for exchanging data (in either direction, along the cable 610) with the handset 604. The other end of the cable 610 may be provided with an electromagnetic (EM) connector 614, for example comprising transceivers (Tx, Rx) such as shown in FIG. 4, for establishing a contactless link with the handset 604. The handset 604 in this example may be enabled with suitable transceivers (Tx, Rx) for contactless communication (compare "Device 2" in FIG. 4).

Power may be provided from the host device 602 to the cable 610, via the connector 612. Power may be provided from the cable 610 to the handset 604 via magnets and electrical connections, as shown in FIG. 4, or wirelessly (inductively) via transformer coupling between a coil (not shown) in the connector 614 and a corresponding coil (not shown) in the device 604. Power may also flow in the opposite direction along the cable 610, from the device 604 to the device 602. The combination of contactless (EM) communication and wireless power enables the device 604 to be completely enclosed, and protected from the environment.

Figure 6B:
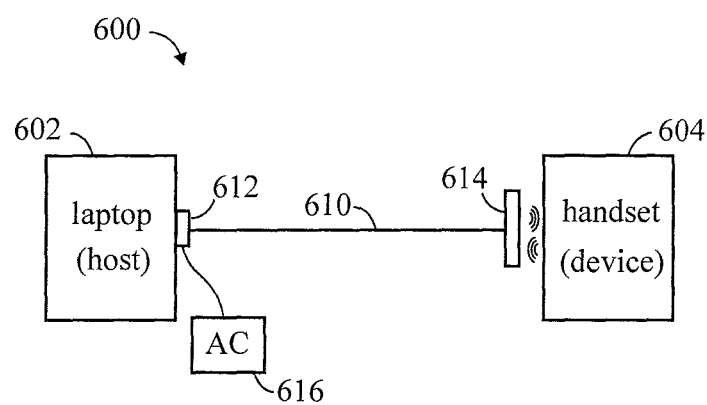

FIG. 6B illustrates that (alternatively to the deployment shown in FIG. 6A) power may be supplied to the cable 610 by a separate power supply (such as an AC adapter) 616, for powering the device (handset) 604. In this case, it is possible that data may not be transmitted through the cable 610, and the host device 602 need not be present.

Connecting Source and Destination Devices Via Physical Links and Wireless Links

Figure 7A:
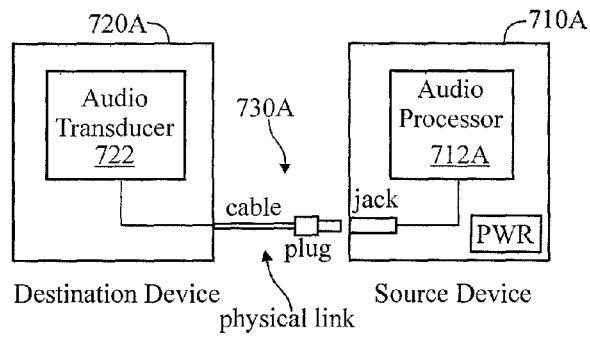
FIG. 7A is a diagram of a source device connected with a destination device by a physical link.
Figure 7B:
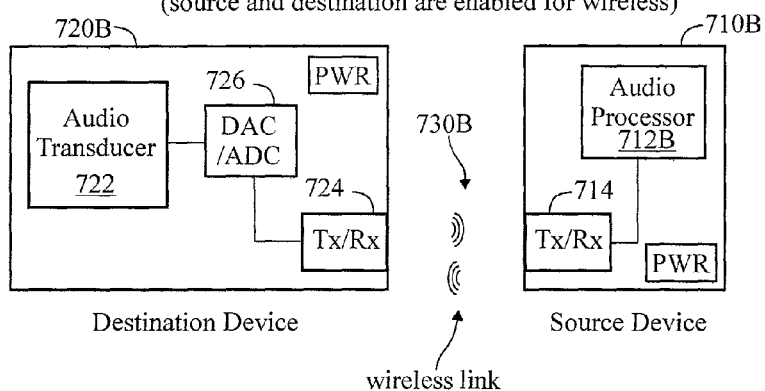
FIG. 7B is a diagram of a source device connected with a destination device by a wireless link.
Figure 7C:
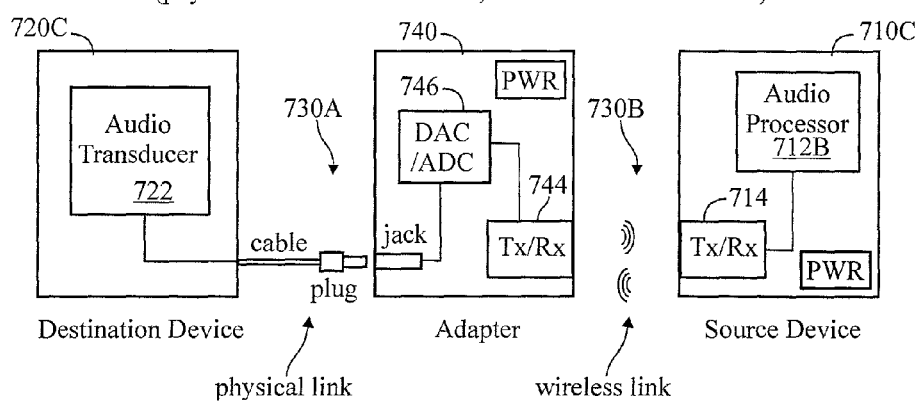
FIG. 7C is a diagram of a source device connected with a destination device via an adapter.

FIGS. 7A, 7B, and 7C illustrate some exemplary connections (links) between devices such as a source device and at least one destination device. Signals transported on the links between the source and destination devices may be representative of audio data, such as compressed or uncompressed digital data, or analog data.

An exemplary source device 710 ("A", "B" and "C" versions shown) may comprise a computer, laptop, tablet, smart phone, or comparable electronic device which can obtain and process audio data which may be stored internally within the device (in internal storage, such as hard disc drive, solid state memory, and the like), or retrieved by the device from external storage (such as external hard drive, flash memory stick, and the like), or received by the device from an external source (such as via a Local Area Network, the Internet, or the like). The source device 710 may be provided with its own internal power ("PWR") source, such as a rechargeable battery, and may also be powered (including recharging the battery) by an external power supply (AC). An audio processor 712 ("A", "B" and "C" versions shown) within the source device 710 prepares the stored, retrieved or received audio data for transmission as an analog signal, or as a digital signal such as a PCM data stream on the link between the source device 710 and the destination device 720.

An exemplary destination device 720 ("A", "B" and "C" versions shown) may comprise one or more audio transducers. A speaker is an example of an audio transducer that produces sound in response to an electrical input. A microphone is an example of an audio transducer that produces an electrical signal in response to sound input. In both cases (speaker and microphone) the electrical signal is typically in analog format. The audio transducers may be incorporated into an audio headset. A conventional audio headset may comprise one or more speakers and a microphone, also a cable and plug for inserting into the jack of a remote device (such as an MP3 music player). A conventional audio headset is inexpensive, typically contains no electronics, and is not powered (needs no battery). Bluetooth wireless headsets are powered devices having speaker(s) and a microphone, and their own internal power ("PWR") source and electronics for converting a digital signal received from a device (such as a Bluetooth-enabled mobile phone) to an analog signal for the speaker(s), and for converting an analog signal from the microphone into a digital signal suitable for wireless transmission to the device.

In the descriptions that follow, some well known elements (such as data storage and Internet connections) may be omitted for illustrative clarity, and some well understood connections between elements which are shown may also be omitted for illustrative clarity.

FIG. 7A shows an example of a source device 710A connected with a destination device 720A via a physical link 730A. The source device 710A comprises an audio processor 712A which may receive audio data (such as MP3 files) from an internal source such as data storage (not shown) or from an external source such as an Internet connection (not shown). The audio processor 712A outputs a signal, such as in analog format, to a connector (jack). The source device 710A is shown having its own source of power ("PWR"), such as an internal re-chargeable battery, but may be alternatively or additionally powered by an external AC adapter (not shown). In this example, the destination device 720A may be a conventional headset having at least one audio transducer 722 such as headphone(s) and optionally a microphone, and is connected by a cable and plug to the source device 710A. Typically, in this configuration, analog audio signals will be transported over the physical link 730A.

FIG. 7B shows an example of a source device 710B connected with a destination device 720B via a wireless link 730B. The source device 710B comprises an audio processor 712B which may receive audio data (such as MP3 files) from an internal source such as data storage (not shown) or from an external source such as an Internet connection (not shown). The audio processor 712B outputs a signal, such as in digital format, to a transmitter (Tx) or transceiver (Tx/Rx) 714. The source device 710B is shown having its own source of power ("PWR"), such as an internal re-chargeable battery, but may be alternatively or additionally powered by an external AC adapter (not shown). In this example, the destination device 720B is a wireless-enabled headset having headphone(s) and optionally a microphone, and further comprising a receiver (Rx) or transceiver (Tx/Rx) 724 for communicating wirelessly, over the wireless link 730B, with the transmitter (Tx) or transceiver (Tx/Rx) 714, respectively, in the source device 710B. If the signal received by the destination device 720B from the source device 710B is in digital format, it may be converted to analog format by a DAC portion of a DAC/ADC 726, or any other suitable means for performing the digital-to-analog conversion. For a signal which is originally in analog format to be transmitted from the destination device 720B to the source device 710B, the analog signal may be converted to digital format by the ADC portion of the DAC/ADC 726, or any other suitable means for performing the analog-to-digital conversion. The destination device 720B is shown having its own source of power ("PWR"), such as an internal re-chargeable battery. Typically, in this configuration, digital audio signals will be transported over the wireless link 730B.

In the configuration shown in FIG. 7B, the wireless link 730B may be a Bluetooth link, and the destination device 720B may be a Bluetooth headset. Batteries and associated electronics are required in the headset, adding to its complexity and cost. The source device 710B is shown as being "wirelessly-enabled", having its own Bluetooth (e.g.) transceiver (Tx/Rx). If the source device 710B is not wirelessly-enabled, a suitable adapter (such as USB to Bluetooth) can be plugged into the source device 710B to provide wireless communication capability.

FIG. 7C shows an example of a source device 710C connected with an adapter 740 via a wireless link 730B, and the adapter 740 connected with a destination device 740C via a physical link 730A. The adapter 740 may be configured to perform conversion (means for converting) between a wireless link (such as Bluetooth) and a physical link (plug and jack), and vice-versa. The source device 710C may be substantially identical to the source device 710B, having a transceiver (Tx/Rx) 714 for establishing the wireless link 730B with a corresponding transceiver (Tx/Rx) 744 (compare 724) in the adapter 740. The destination device 720C may be substantially identical to the destination device 710A, having a cable and plug for establishing the physical link 730A with a jack in the adapter 740. The adapter 740 is shown having its own source of power ("PWR"), such as an internal re-chargeable battery, but may be alternatively or additionally powered by an external AC adapter (not shown).

If the signal received by the adapter 740 from the source device 710C is digital, it may be converted to analog format by a DAC portion of a DAC/ADC 746 or any other suitable means for performing the digital-to-analog conversion. For a signal from the destination device 720C which is originally in analog format to be transmitted from the adapter 740 to the source device 710C, the analog signal may first be converted to digital format by an ADC portion of the DAC/ADC 746 or any other suitable means for performing the analog-to-digital conversion.

This configuration shown in FIG. 7C allows for a conventional headset to communicate wirelessly with a wireless-enabled source device and may, for example, utilize Bluetooth for the wireless link 730B.

Some applications (deployments) for the electromagnetic (EM) link will now be described in the context of connecting a source device such as a computer, laptop or handheld device with a destination device such as headphones or a headset. In the main, hereinafter, the flow of audio signals in one direction may be described, such as from the source device to the destination device, but it should be understood that the flow of signals in the opposite direction (from destination device to source device), and in both directions is contemplated.

An Exemplary Adapter for Converting Between a Contactless Link and a Physical Link Some applications (deployments) for the electromagnetic (EM) link will now be described in the context of connecting a source device such as a computer, laptop or handheld device with a destination device such as headphones or a headset. In the main, hereinafter, the flow of audio signals in one direction may be described, such as from the source device to the destination device, but it should be understood that the flow of signals in the opposite direction (from destination device to source device), and in both directions is contemplated.

Figure 8:
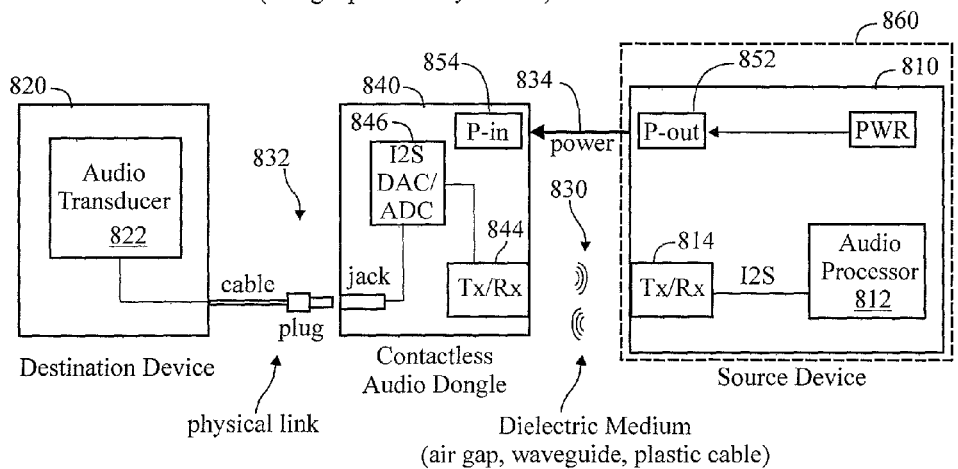
FIG. 8 is a diagram of a source device connected with a destination device via an adapter.

FIG. 8 shows an example of a source device 810 connected with a contactless audio adapter (or simply "adapter") 840 via a contactless link 830, and the adapter 840 connected with a destination device 820 via a physical link 832. The adapter 840 may be configured to perform conversion between the contactless link 830, such as EHF over a dielectric medium and the physical link 832, such as plug and jack (and cable), and vice-versa (from physical link to contactless link). The jack, plug and cable are examples of means for exchanging analog electrical signals originating at the adapter 840 with the destination device 820 device over the physical link 832. Alternatively, the physical link 832 may comprise a direct wired connection.

The source device 810 comprises an audio processor 812 which may receive audio data (such as MP3 files) from an internal source such as data storage (not shown) or from an external source such as an Internet connection (not shown). The audio processor 812 outputs a signal, such as in digital format, such as (but not limited to) over an I2S bus, to a transmitter (Tx) or transceiver (Tx/Rx) 814. The transceiver (Tx/Rx) is exemplary of means for establishing the contactless link 830 with a corresponding transceiver (Tx/Rx) 844 in the adapter 840. Typically, in this configuration, digital audio signals will be transported over the contactless link 830. Modulation may be OOK (on/off keying) or other similar simple modulation techniques. An advantage of the contactless link is that it may not require any additional system software on the source device 860, and can be made transparent to the system.

The transceivers 814 and 844 are examples of means for communicating EHF signals contactlessly between the first device 810 and the audio adapter 840 through a dielectric medium (230, 300), and for converting between EHF signals and digital electrical signals. It should be understood that if only one-way communication is required, such as from the source device 810 to the audio adapter 840, the transceiver 814 could be replaced by a transmitter (Tx, compare 402) and the transceiver 844 could be replace by a receiver (Rx, compare 422). Communication between the source device 810 and the audio adapter 840 may be half-duplex or full duplex.

The source device 810 is shown having its own source of power ("PWR"), such as an internal re-chargeable battery, but may be alternatively or additionally powered by an external AC adapter (not shown).

The destination device 820 may be a conventional headset comprising at least one audio transducer 822 such as headphone(s) and optionally a microphone, and may be connected by a cable and plug to the adapter 840. Typically, in this configuration, analog audio signals will be transported over the physical link 832.

If the signal received by the adapter 840 from the source device 810 is digital, it may be converted to analog format by a DAC portion of a DAC/ADC 846 or any other suitable means for performing the digital-to-analog conversion (means for converting between digital electrical signals and analog electrical signals). For a signal from the destination device 820 which is originally in analog format to be transmitted from the adapter 840 to the source device 810, the analog signal may first be converted to digital format by an ADC portion of the DAC/ADC 846 or any other suitable means for performing the analog-to-digital conversion. The PCM510x 2VRMS DirectPath™, 112/106/100 dB Audio Stereo DAC with 32-bit, 384 kHz PCM Interface by Texas Instruments, the specification of which is incorporated by reference herein, is cited as an exemplary DAC/ADC 846.

This configuration shown in FIG. 8 allows for a conventional headset to communicate contactlessly, via the adapter 840, with a contactless-enabled source device and may, for example, utilize EHF over a dielectric medium for the contactless connection between the adapter 840 and the source device 810. As used herein, "dielectric medium" may comprise an air gap, waveguide, plastics (polyethylene, thermoplastic polymers, polyvinylidene difluoride, fluoropolymers, ABS, and other plastics), plastic cable (see FIG. 3), or the like.

It should be understood that digital audio signals (such as from an I2S bus) may be packetized and transmitted by one transceiver (such as Tx/Rx 814 at the source device 810), and received and unpacketized and decoded by another transceiver (such as Tx/Rx 844 at the audio adapter 840). The data link thus established can support extremely high quality audio signals from the source device (or "host" device) to the audio adapter (or "remote" device). Flow of data may also occur in the reverse direction, from remote device to host device.

It should be understood that the transceivers 814 and 844 (or separate circuits, not shown) may comprise means for encoding and combining constituent signals of a multi-wire standards-based electrical interface (such as I2S) into a single encoded digital stream for transport (in either or both directions) over the EHF communications link 830, and for subsequently (at the other end of the link 830) decoding and dividing (separating) the signal into replicas of the original constituent signals for the standards-based electrical interface. In this manner, transparency may be achieved.

In contrast with the adapter 740 (FIG. 7C), the adapter 840 may not be powered (may not have its own internal source of power ("PWR")). In order to provide power to the adapter 840, the source device 810 may be provided with suitable means for providing power (P-out) 850 to the adapter 840 which is provided with suitable means for receiving power (P-in) 852, thereby establishing a power link 834 between the source device 810 and the adapter 840. The power link 834 provides power for the adapter 840 to operate, and the adapter 840 can then provide power via the cable to the destination device 820 (such as for microphones requiring a supply voltage to operate, noise cancelling headphones, and the like).

One possibility for the power link 834 has been described hereinabove, with respect to FIG. 3, wherein power (and ground) may be provided via the plastic cable 300 connecting two devices, the plastic cable 300 being provided with two or more metallizations 306, 308 extending extend along the length of the dielectric medium 302, such as for electrical shielding, or for conveying power and ground (GND). One end of the plastic cable (300) may be disposed touching, or very close to the transceiver 814 of the source device 810, the other end of the cable (300) may be disposed touching, or very close to the transceiver 844 of the adapter 840.

Another possibility for the power link 834 has been described hereinabove, with respect to FIG. 4, wherein power (and ground) may be provided via connectors 440, 460 containing the components for establishing the contactless data link between two devices, and which also utilize magnets (442, 444) and ferrous elements (462, 464) to establish conductive paths (452, 454) between the two devices. In this example, a connector, or the adapter itself may be mounted to the source device 810.

By establishing a contactless data link (830) with the source device 810, and in some cases additionally establishing a contactless power link (834), the source device 810 may be encased (enclosed) in a non-conducting barrier 860 (compare 240, FIG. 2). Electromagnetic (EM) radiation may pass easily through the barrier 860, but electrical current cannot pass easily through the barrier 860. The barrier 860 can therefore isolate circuit board and fragile chips from ESD (electrostatic discharge). The barrier 860 may also hermetically seal the device. The barrier 860 may additionally provide a benefit to devices such as cell phones, for example protecting them from moisture and humidity. The electromagnetic interface (EM) techniques disclosed herein may completely eliminate the need for any mechanical connectors or other openings in the device.

Figure 8A:
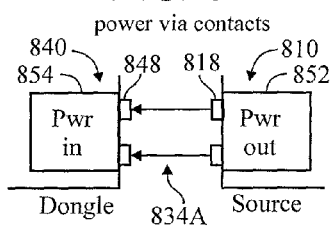
FIGS. 8A, 8B, 8C are diagrams illustrating embodiments of powering the adapter of FIG. 8.

FIG. 8A illustrates an embodiment of establishing a power link 834A between the source device 810 and the adapter 840. Here the power link 834A is illustrated as comprising two conductive paths (arrows) between terminals (conductive points, two shown) 818 on the source device 810 and corresponding terminals (conductive points, two shown) 848 on the audio adapter 840. When the audio adapter 840 is mounted to the source device 810 (such as by magnets), power may flow from "P-out" 852 on the source device 810 to "P-in" 854 on the audio adapter 840, via the contacts 818/848. This is comparable to FIG. 4, as described above.

Figure 8B:
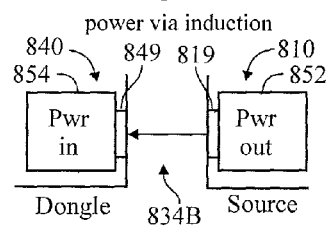

FIG. 8B illustrates an embodiment of establishing a power link 834B between the source device 810 and the audio adapter 840. Here the power link 834B is illustrated as an inductive coupling path (arrow) between an inductive coil 819 in the source device 810 and a corresponding inductive coil 849 in the audio adapter 840. When the audio adapter 840 is mounted to the source device 810 (such as by magnets), power may flow from "P-out" 852 on the source device 810 to "P-in" 854 on the audio adapter 840, via inductive coupling between the coils 819/849. This is similar to the embodiment of FIG. 8A in that power for the audio adapter 840 is supplied by the source device 810, via "P-out" 852.

Although not specifically illustrated, in the embodiments of FIGS. 8A and 8B, suitable means for mounting (attaching) the audio adapter 840 to the source device 810, to ensure touching of the contacts 818/848 or close proximity of the coils 819/849 may comprise magnets/ferrous material or means for mechanically attaching (or abutting), including fasteners, adhesives, mechanical structures, frictional adhesives, and the like.

Figure 8C:
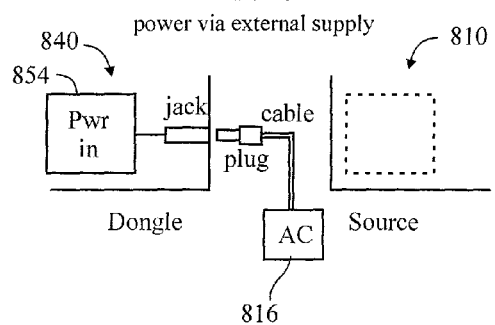

FIG. 8C illustrates a variation of the above, wherein power for the audio adapter 840 is provided to "P-in" 854 by a separate power supply (such as an AC adapter) 816 (compare 616, FIG. 6B). In this embodiment, it is not necessary to have "P-out" 852 in the source device 810. The power supply 816 is shown having a cable and a plug for plugging into a corresponding jack on the audio adapter 840.

Some Contrasts Between the Audio Adapter 840 and the Bluetooth Adapter 740

As mentioned above, the audio adapter 840 does not need (and may not have) its own power source ("PWR"), but rather may be powered by the source device 810 (or by a separate AC adapter). The cost of a battery can be avoided, along with consequent weight and space savings.

The audio data link 830 between the source device 810 and the audio adapter 840 is contactless, operating for example in the EHF range, over a dielectric medium. Electromagnetic signals pass between the source device 810 and the audio adapter 840 in the "near field", primarily over an anisotropic physical path, which may be an air gap, typically over a range of up to only a few centimeters. (Of course, once the signal is in the cable 300, this distance can be several meters, or more.) In contrast thereto, the Bluetooth adapter 740 communicates with the source device primarily by radiation, omni-directionally, and the range is typically limited to a few meters.

By virtue of the communications link 830 being up to only a few centimeters, and anisotropic over a physical path, the power required to maintain communication may be minimized, such as to below 50 mw. Typically, a Bluetooth link (730B), relying primarily on radiation and typically involving distances up to meters, may require significantly more power.

Operating at frequencies in the EHF range, such as 30-300 GHz, the audio adapter 840 may be able to maintain a higher bit rate than its Bluetooth counterpart (adapter 740) which operates at 2.4-2.5 GHz. This higher operating frequency facilitates data exchange rates of up to 6 Gbit/sec, or higher, which enables high-quality audio streaming, multi-streaming, etc.

Modulation may be simplified in the audio adapter 840 by using modulation OOK (on/off keying) or other similar simple modulation techniques, in contrast with Bluetooth which utilizes more sophisticated techniques such as GFSK, π/4-DQPSK and 8 DPSKpacket-based protocol which consume system resources.

The contactless link (830) between the source device 810 and the audio adapter 840 may be set up substantially instantaneously, and validation is a simple matter of detecting the device (proximity). In contrast thereto, Bluetooth links (730B) may require discovery, verification and validation codes. Latency in the contactless link (830) may be on the order of sub-nanosecond. Bluetooth links (740B) may require tens of milliseconds or longer to encode and packetized data, including error correction codes, making is barely adequate for bi-directional communication.

An additional advantage of the contactless link (830) is that the contactless link (830) may not require any additional system software on the source device (860), whereas the Bluetooth link (730B) requires software drivers to enable setup of the Bluetooth device and to enable audio to be sent to and received from the Bluetooth device. The contactless link (830) can be made transparent to the system (860) and no additional software or setup may be required to use the contactless audio adapter (840).

These and some other differences between the contactless link (830) and the wireless link (740B) may be summarized in the following Table.

|  | Audio Adapter 840 | Bluetooth Adapter 740 |
|---|---|---|
| power source | powered externally | powered internally |
| frequency | 30-300 GHz, or higher | 2.4-2.5 GHz |
| mode of propagation | anisotropic physical path | omni-directional |
| primary operating distance | up to a few centimeters | a few meters |
| network type | point-to-point | WPAN |
| bit rate | up to 6 Gbit/sec | 2.1 Mbit/s |
| discovery/set up time | substantially instantaneous, validation based on proximity | discovery, verification, validation codes |
| modulation | OOK (on/off keying) | GFSK, π/4-DQPSK and 8DPSK packet-based protocol |
| latency/transparency | low, sub-ns transparent to system/software | tens of milliseconds, or longer software required |
| system overhead | none | encode/packetize/ECC |

While the invention(s) has been described with respect to a limited number of embodiments, these should not be construed as limitations on the scope of the invention(s), but rather as examples of some of the embodiments. Those skilled in the art may envision other possible variations, modifications, and implementations that are should also be considered to be within the scope of the invention(s), based on the disclosure(s) set forth herein, and as may be claimed.

What is claimed is:

1. An audio adapter for providing a communications link between a first device which comprises at least a source of electronic audio signals and a second device which comprises at least a destination for electronic audio signals, the audio adapter comprising:
   means for converting between digital electrical signals and analog electrical signals; and
   means for exchanging the analog electrical signals with the second device over a physical link;
   characterized by:
   means for communicating EHF signals contactlessly with the first device over an anisotropic physical path through a dielectric medium, and for converting between EHF signals and digital electrical signals, wherein the anisotropic physical path through the dielectric medium is further characterized by a point-to-point contactless communications scheme that has an effective range on the order of one centimeter when the dielectric medium is air.

2. The audio adapter of claim 1, further comprising:
   means for receiving power from an external power source and for providing the power to at least one of the first and second devices.

3. The audio adapter of claim 2, wherein:
   the means for receiving power comprises at least one of contacts on the audio adapter, and an inductive coil within the audio adapter.

4. The audio adapter of claim 2, wherein:
   the external power source comprises at least one of contacts on at least one of the first and second devices, a coil disposed in at least one of the first and second devices, and an external power supply.

5. The audio adapter of claim 1, further comprising:
   means for mounting the audio adapter to at least one of the first and second devices.

6. The audio adapter of claim 1, wherein:
   the means for communicating and for converting comprises at least one of a receiver and a transmitter.

7. The audio adapter of claim 1, wherein:
   the means for exchanging the analog electrical signals with the second device comprises a jack.

8. The audio adapter of claim 1, wherein:
   the means for exchanging the analog electrical signals with the second device comprises a direct wired connection.

9. The audio adapter of claim 1, wherein:
   at least one of the first and second devices device comprises a host audio source.

10. The audio adapter of claim 1, wherein:
    at least one of the first and second devices device comprises an audio transducer.

11. The audio adapter of claim 1, wherein:
    the first device comprises a destination for audio signals; and
    the second device comprises a source for audio signals.

12. The audio adapter of claim 1, wherein at least one of the first and second devices further comprises:
    means for decoding and dividing a single encoded digital stream representing constituent signals of a multi-wire standards-based electrical interface into replicas of the original constituent signals.

13. The audio adapter of claim 1, wherein at least one of the first and second devices further comprises:

means for encoding and combining constituent signals of a multi-wire standards-based electrical interface into a single encoded digital stream for transport over the dielectric medium.

14. A method of interfacing a first device comprising a source of electronic audio signals with a second device comprising a destination for electronic audio signals, comprising providing an audio adapter for providing a communications link between the first and second devices, with the audio adapter converting between digital electrical signals and analog electrical signals and exchanging the analog electrical signals with the second device over a physical link, characterized by:

with the audio adapter, communicating contactlessly at extremely high frequency (EHF) over an anisotropic physical path through a dielectric medium with the first device, wherein the anisotropic physical path through the dielectric medium is further characterized by a point-to-point contactless communications scheme that has an effective range on the order of one centimeter when the dielectric medium is air.

15. The method of claim 14, further comprising:

with the audio adapter, performing at least one of (i) decoding and dividing a single encoded digital stream representing constituent signals of a multi-wire standards-based electrical interface into replicas of the original constituent signals and (ii) encoding and combining constituent signals of a multi-wire standards-based electrical interface into a single encoded digital stream for transport over the dielectric medium.

16. The method of claim 14, further comprising:

at the audio adapter, receiving power from an external power source comprising one of the first device and an external power supply.

17. The method of claim 16, further comprising:

with the audio adapter, providing the power to the second device.

* * * * *